(12) United States Patent
Hsu et al.

(10) Patent No.: US 7,379,004 B2
(45) Date of Patent: May 27, 2008

(54) DRIVING CIRCUIT AND METHOD FOR INCREASING EFFECTIVE BITS OF SOURCE DRIVERS

(75) Inventors: Chin-Hung Hsu, Tao-Yuan (TW);
Ming-Lin Lee, Taichung (TW);
Chun-Chieh Chen, Tao-Yuan (TW);
Nan-Ku Lu, Taipei (TW)

(73) Assignee: Hannstar Display Corp., Tao-Yuan (TW)

( * ) Notice: Subject to any disclaimer, the term of this patent is extended or adjusted under 35 U.S.C. 154(b) by 0 days.

(21) Appl. No.: 11/340,581

(22) Filed: Jan. 27, 2006

(65) Prior Publication Data
US 2007/0176811 A1    Aug. 2, 2007

(51) Int. Cl.
*H03M 1/66* (2006.01)

(52) U.S. Cl. ............... 341/144; 341/118; 341/145; 341/154; 345/84; 345/87; 345/88; 345/89; 345/99; 345/100

(58) Field of Classification Search ............... None
See application file for complete search history.

(56) References Cited

U.S. PATENT DOCUMENTS

| | | | | |
|---|---|---|---|---|
| 5,877,717 | A * | 3/1999 | Tu et al. | 341/150 |
| 6,118,421 | A * | 9/2000 | Kawaguchi et al. | 345/89 |
| 6,326,913 | B1 * | 12/2001 | Chao et al. | 341/144 |
| 6,373,419 | B1 * | 4/2002 | Nakao | 341/154 |
| 6,437,716 | B2 * | 8/2002 | Nakao | 341/118 |
| 6,441,763 | B1 * | 8/2002 | Nakao | 341/154 |
| 6,570,560 | B2 * | 5/2003 | Hashimoto | 345/211 |
| 6,677,923 | B2 * | 1/2004 | Kajihara et al. | 345/89 |
| 6,756,959 | B2 * | 6/2004 | Fujino | 345/95 |
| 6,762,737 | B2 * | 7/2004 | Kajihara et al. | 345/89 |
| 6,798,368 | B2 * | 9/2004 | Jung et al. | 341/144 |
| 6,879,310 | B2 * | 4/2005 | Nose | 345/88 |
| 6,950,045 | B2 * | 9/2005 | Kim | 341/118 |
| 6,963,325 | B2 * | 11/2005 | Yano et al. | 345/94 |
| 7,050,028 | B2 * | 5/2006 | Morita | 345/90 |
| 7,071,669 | B2 * | 7/2006 | Morita | 323/297 |
| 7,079,127 | B2 * | 7/2006 | Morita | 345/212 |
| 7,084,845 | B2 * | 8/2006 | Hong | 345/89 |
| 7,095,394 | B2 * | 8/2006 | Hong | 345/89 |
| 7,106,321 | B2 * | 9/2006 | Morita | 345/211 |
| 2002/0180680 | A1 * | 12/2002 | Moon | 345/89 |
| 2006/0022925 | A1 * | 2/2006 | Hara et al. | 345/89 |
| 2006/0181544 | A1 * | 8/2006 | Morita | 345/600 |

* cited by examiner

*Primary Examiner*—Khai M Nguyen
(74) *Attorney, Agent, or Firm*—Birch, Stewart, Kolasch & Birch, LLP

(57) ABSTRACT

An LCD driving circuit and method for increasing effective bit(s) of the source driver is disclosed. A reference voltage generator generates a group of compensated reference voltage levels that are interlaced with original reference voltage level of original reference voltage generator. One of the multiple groups of reference voltage levels is selected by one or more least significant bits (LSBs), and is then inputted to digital-to-Analog converter of the source driver under control of the one or more least significant bits (LSBs), thereby effectively and economically enhancing the gray levels of the display on the LCD panel.

19 Claims, 7 Drawing Sheets

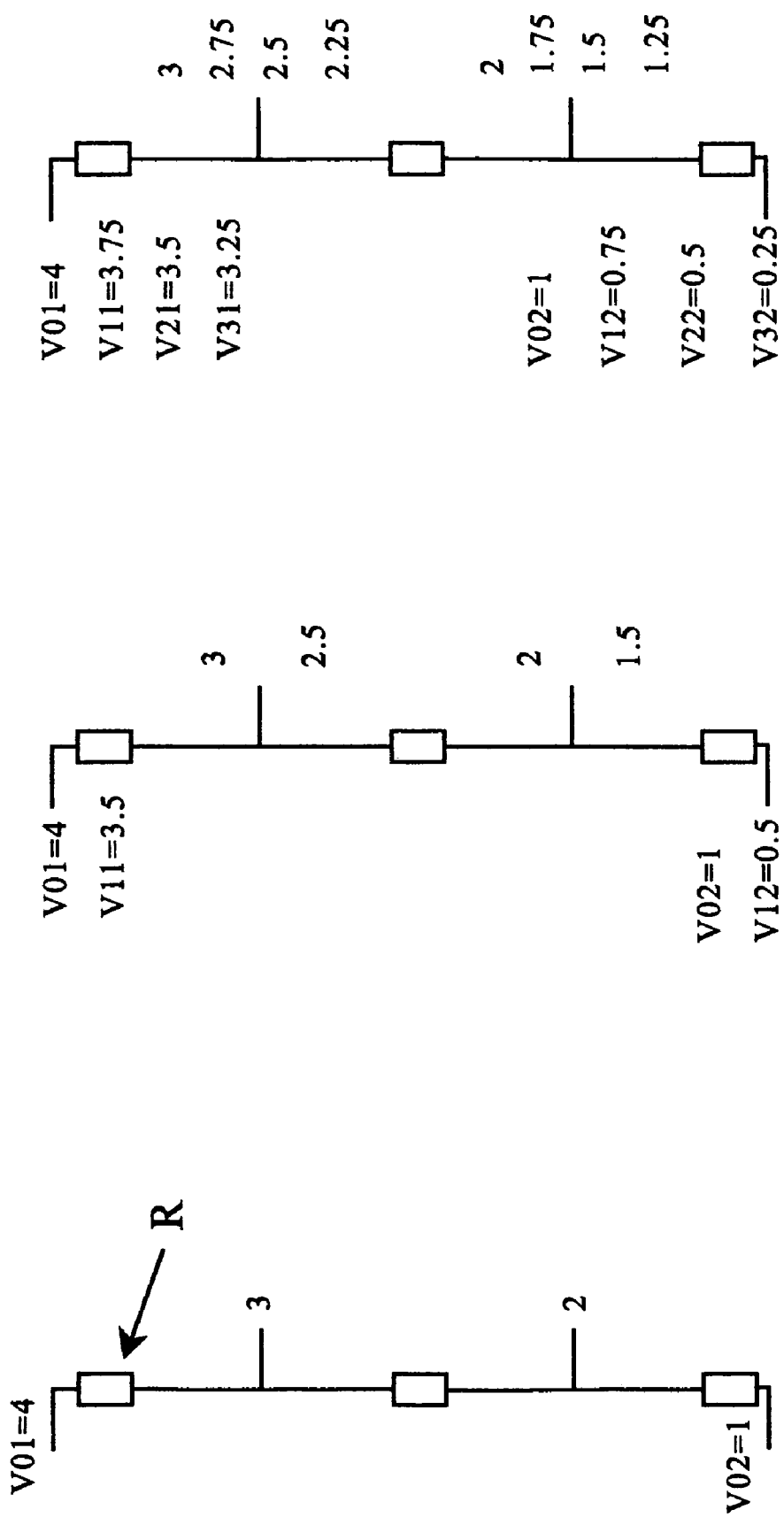

DRIVING CIRCUIT AND METHOD FOR INCREASING EFFECTIVE BITS OF SOURCE DRIVERS

BACKGROUND OF THE INVENTION

1. Field of the Invention

The present invention relates to an LCD panel driving circuit, and more particularly to an LCD driving circuit and method for increasing effective bit(s) of source drivers thereof.

2. Description of the Prior Art

Liquid crystal displays (LCDs) have been widely used, for example, in notebook computers or television, for the advantages of low radiation, low power consumption, and light weight. As the 6-bit Digital-to-Analog converter (DAC) of the LCD that only provides 64 scales (or levels) has become unsatisfactory to users, some schemes are disclosed to increase effective bits of the DAC, among which frame rate control (FRC) is a technique, utilized to increase effective bit(s) in the DAC. In the FRC technique, for example, four frames of the original black and white scales are sequentially displayed to make out five different scales in vision effect. Among the five scales, two scales (i.e., the black and white) are the original scales, and the other three scales are generated through the FRC technique. Accordingly, the DAC used in FRC technique having 1 bit (i.e., two original scales) substantially functions as a 3-bit (i.e., 1+2 bits) DAC, in which five scales are displayable. Similarly, a DAC having 2 bits (i.e., four original scales) substantially functions as a 4-bit (i.e., 2+2 bits) DAC, in which 13 (3×3+4) scales are displayable. Likewise, a DAC having 6 bits (i.e., 64 original scales) substantially functions as an 8-bit (i.e., 6+2 bits) DAC, in which 253 (3×63+64) scales are displayable. There is need for improving or even replace the FRC technique for the reason that it does not provide complete set of scales to the DAC. For example, 253 instead of 256 full scales are provided by the 6-bit DAC with the FRC technique. Furthermore, the DAC possesses noise-like flicker on display, especially for the large-size panel.

SUMMARY OF THE INVENTION

An object of the present invention is to increase the effective bits of the DAC of the source drivers without physically substituting a high-bit (high-cost) DAC for the original low-bit (low-cost) DAC, thereby effectively and economically enhancing the gray level and improving the resolution of the display on the LCD panel.

According to the object, the present invention discloses an LCD driving circuit and method for increasing effective bit(s) of the source driver. A multi-reference voltage generator generates multiple groups of voltage levels that are interlaced with the original voltage levels of the source driver. One of the multiple groups of voltage levels is selected by a timing controller, and is then inputted to the source driver under control of the timing controller.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the following detailed description and the accompanying drawings, which are given by way of illustration only, and thus are not limitative of the present invention, wherein:

FIG. 2A to FIG. 2C show a simplified example illustrating how an original 2-bit DAC effectively provides 3-bit and 4-bit function;

DESCRIPTION OF THE PREFERRED EMBODIMENT

The detailed description of the present invention will be discussed in the following embodiments, which are not intended to limit the scope of the present invention, but can be adapted for other applications. While drawings are illustrated in details, it is appreciated that the quantity of the disclosed components may be greater or less than that disclosed, except expressly restricting the amount of the components.

Figure 1A:
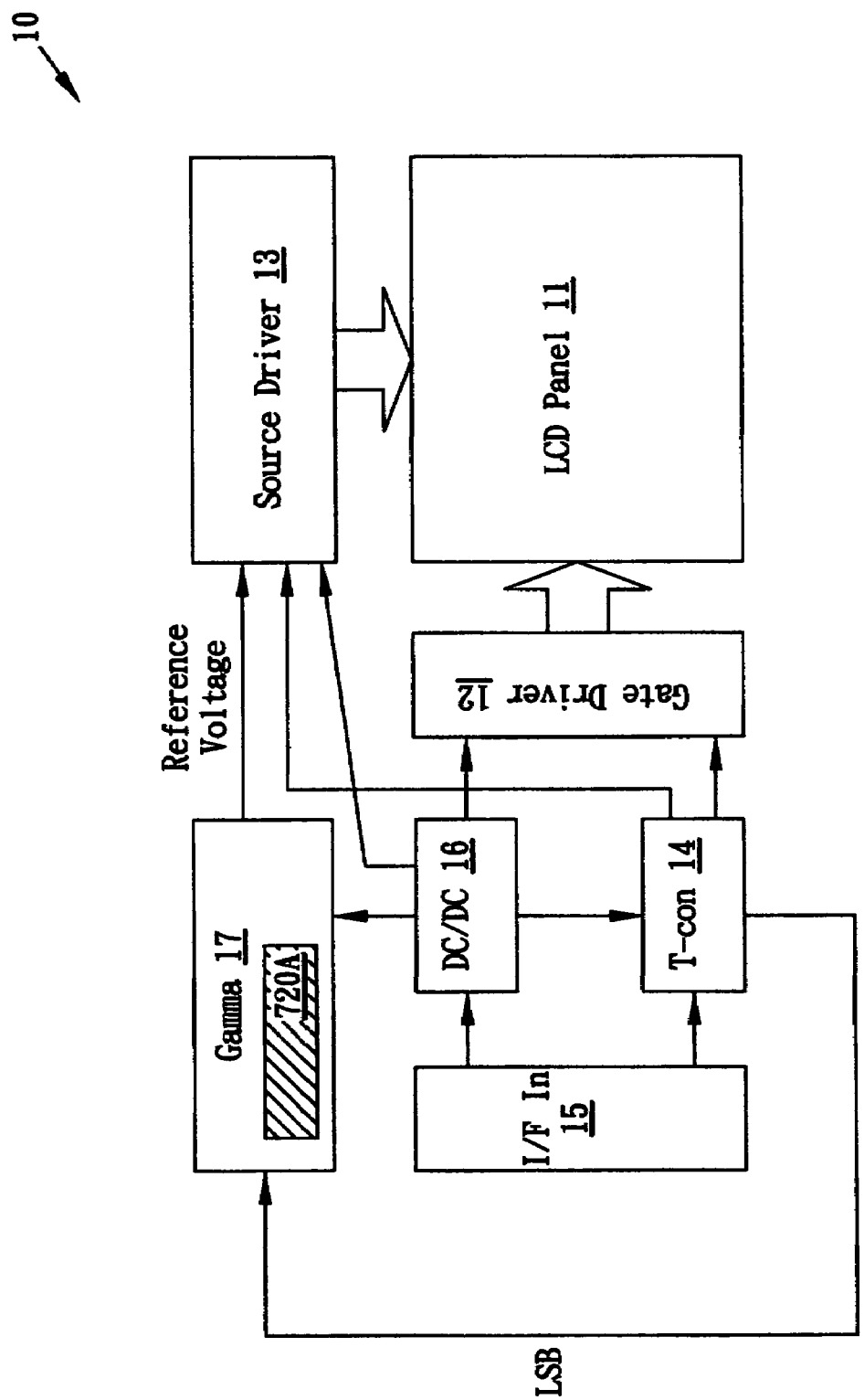
FIG. 1A illustrates an LCD panel driving circuit for increasing effective bits of the source drivers.
Figure 1B:
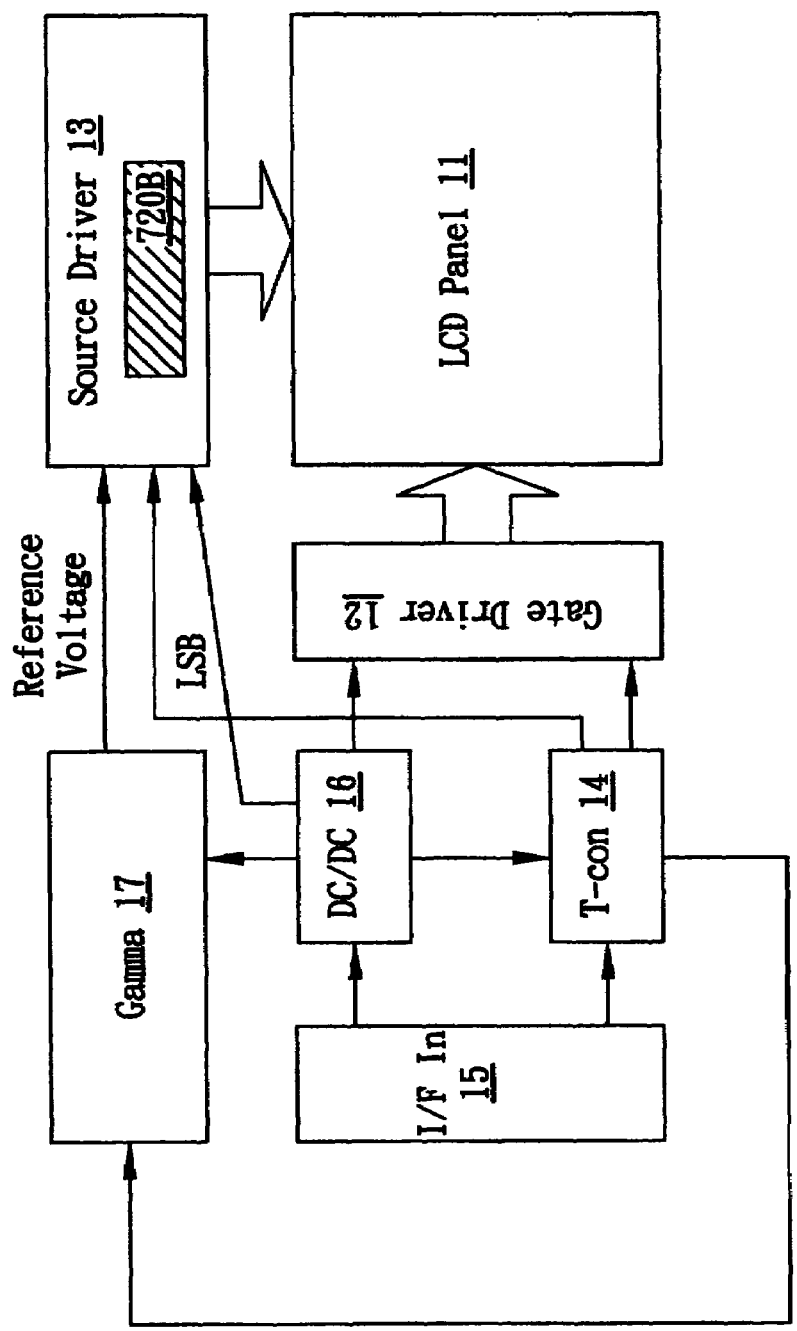
FIG. 1B illustrates another LCD panel driving circuit for increasing effective bits of the source drivers.

FIGS. 1A and 1B conduct two kinds of new driving circuits into LCD panel driving circuit 10 for increasing effective bits of the source drivers. Specifically, add at least one reference voltage generator into LCD panel driving circuit for generating multiple groups of reference voltage levels.

FIG. 1A shows a block diagram of an LCD panel driving circuit 10 according to one embodiment of the present invention. The LCD panel driving circuit 10 primarily includes a Gamma voltage generator 17, a DC/DC converter 16, a timing controller (T-con) 14, a source driver (also known as formed by a plurality of column drivers) 13, a gate driver (also known as formed by a plurality of row drivers) 12, and an LCD panel 11. And the LCD panel 11 (such as thin-film-transistor (TFT) display) is filled with a plurality of liquid crystal molecules, which are driven by the gate driver 12 and the source driver 13. Digital video signals, such as R, G, B video signals, and synchronizing signals are inputted to a timing controller (usually abbreviated as T-con) 14 via an input interface (I/F In) 15. The timing controller 14 then directs the gate driver 12 to control the display timing, and transfers the video signals to the source driver 13, thereby displaying pictures on the LCD panel 11. A DC/DC converter 16 provides required power to other circuits. The DC/DC converter 16 provides required power to the circuits mentioned above, such as the Gamma voltage generator 17, the timing controller 14, the source driver 13, and the gate driver 12. While the (digital) video signals are processed and converted into analog video signals by the source driver 13, the Gamma voltage generator 17 provides generated Gamma voltage levels to the source drivers 13, especially the digital-to-analog (D/A) converter (DAC) therein, to correct or compensate the non-linear distortion of the video signals displayed on the LCD panel 11. Wherein the Gamma voltage generator 17 is a multi-reference voltage generator for providing an original group of reference voltage levels and compensated group of reference voltage levels. A reference voltage generator 720A is embedded in the Gamma voltage generator 17 to generate a compensated group of reference voltage levels to the DAC of the source driver 13. In the other word, the Gamma voltage generator 17 comprises at least two reference voltage generators. The timing controller (T-con) 14 inputs one or more control signals to said Gamma voltage generator 17. The control signals are used to selecting and timing these groups of reference voltage levels by one or more least significant bits (LSBs), where the LSB(s) are, for example, derived from the (digital) video signals inputted into the timing controller 14. Thereafter, the multiple reference voltage levels from the multi-reference voltage generator (i.e. Gamma voltage generator 17) are sequentially and alternatively applied to the DAC of the source driver 13. Specifically, the compensated multiple reference voltage levels are different from the original multiple reference voltage levels. In the other word, the original reference voltage levels are interlaced with the compensated reference voltage levels. In the embodiment, the reference voltage generator 720A is embedded in the Gamma voltage generator 17, but, however, they can be individually implemented in different integrated circuit, or can be integrally designed in the same circuit or implemented in the same integrated circuit. The internal circuitry of the reference voltage generator 720A can be designed and implemented by using conventional circuit design technique, and thus is omitted herein. And the driving method for generating a compensated group of reference voltage levels from said reference voltage generator 720A would be Thither discussed later.

FIG. 1B illustrates another LCD panel driving circuit for increasing effective bits of the source drivers according to another embodiment of the present invention, in which only relevant blocks are shown for simplicity. A reference voltage generator 720B is embedded in the source driver 13. The reference voltage generator 720B and a Gamma voltage generator 17 together provide generated voltage to the DAC of the source driver 13. The timing controller (T-con) 14 inputs one or more of first control signals to the Gamma voltage generator 17 and inputs one or more second control signals to the reference voltage generator 720B. Thereafter, the multiple reference voltage levels including the original multiple reference voltage levels and compensated multiple reference voltage levels are sequentially and alternatively applied to the DAC of the source driver 13. The selection and timing of these multiple reference voltage levels, especially for the reference voltage generator 720B of source driver 13, is defined by one or more least significant bits (LSBs) from the timing controller (T-con) 14, where the LSB(s) are, for example, derived from the (digital) video signals inputted into the timing controller 14. In the embodiment the reference voltage generator 720B is embedded in the source driver 13, but they can be individually implemented in different integrated circuit, or can be integrally designed in the same circuit or implemented in the same integrated circuit. The internal circuitry of the reference voltage generator 720B can be designed and implemented by using conventional circuit design technique, and thus is omitted herein. Specifically, the driving method for generating a compensated group of reference voltage levels from said reference voltage generator 720B would be further discussed later.

Figure 1C:
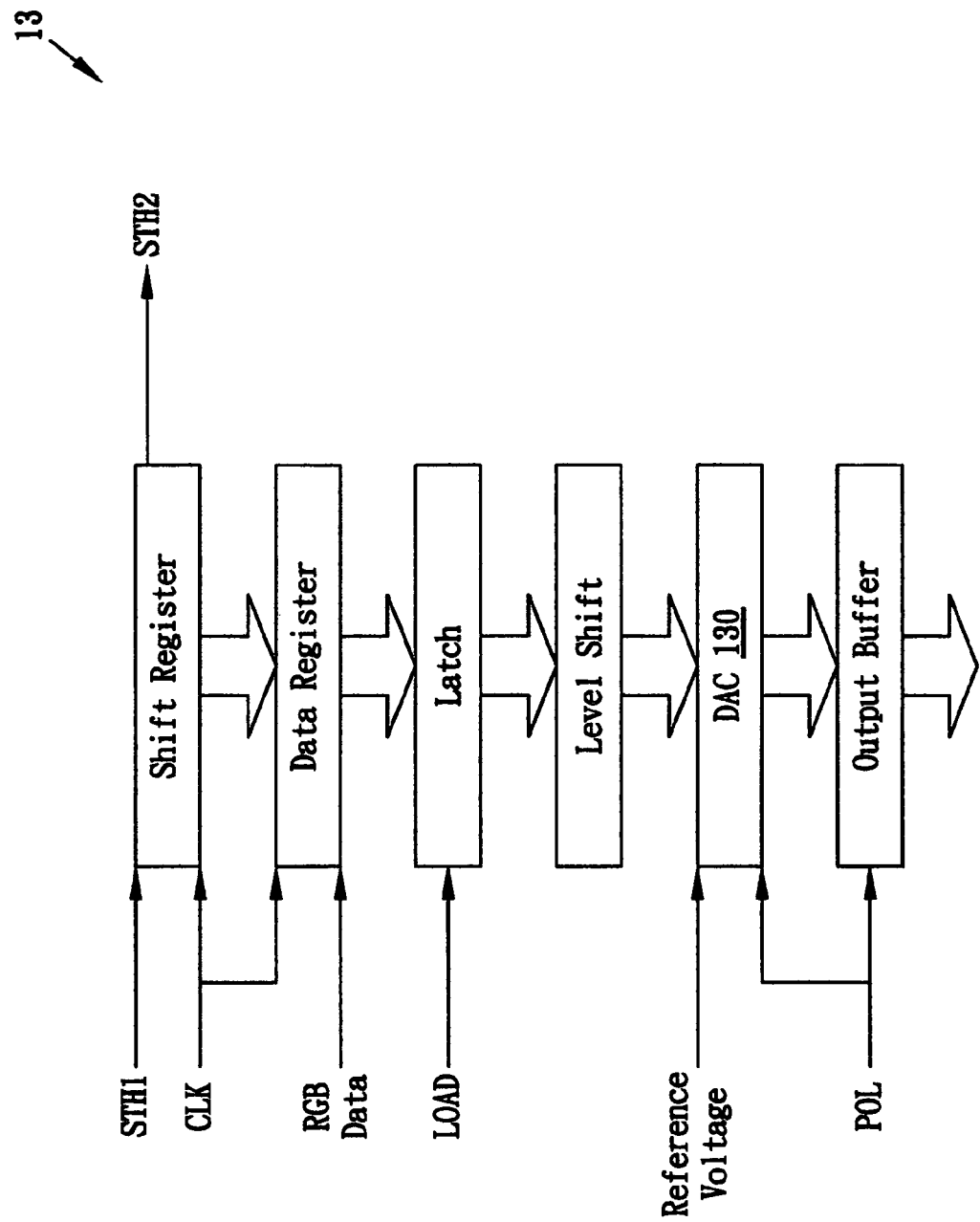
FIG. 1C shows a block diagram of the source driver of FIG. 1A.

Digital-to-Analog converter (DAC) 130 is one of the composing elements in the source driver 13, as shown in FIG. 1C, the block diagram of a source driver 13. The required reference voltage to the DAC 130 is provided by a reference voltage generator 720A or 720B or a Gamma voltage generator 17 to correct or compensate the non-linear distortion of the video signals displayed on the LCD panel 11. The DAC 130 is the dominant composing element because of its large occupying area in the source driver chip. Particularly, the DAC 130 made up of the large amount of resistors occupies substantial chip area. But according to the driving circuit and the driving method of the present invention, 6-bit DAC instead of high-cost and bulky 8-bit DAC is used in the source driver 13. Thus, the source driver 13 will be confined and the whole LCD circuit 10 will be within a reasonable volume, and the manufacturing cost will be economically reduced.

A general n-bit DAC 130 includes $2^n$-1 serially connected resistors (also known as R-DAC) with connected voltage nodes V0, V1, ..., V$2^n$-2, and V$2^n$-1, among which one of the node voltages is selected as an (analog) output and through transmission gate(not shown). Each transmission gate (TG) receives two adjacent node voltages, one of which is selected and propagated downward to another transmission gate. The final (analog) output is thus obtained and is equivalent to the digital counterpart Bn, B1, B0. The generated reference voltages mentioned above are provided to some selected nodes of the serially connected resistors. For example, selected group of the generated reference voltages from the multi-reference voltage generator 17 arc selectively provided at the nodes V0, V15, V31, V47, and V63 for a 6-bit DAC.

The present invention provides a circuit and method for increasing the effective bits of the DAC 130 of the source driver 13 without physically substituting a high-bit (high-cost) DAC for the original low-bit (low-cost) DAC, thereby effectively and economically enhancing the gray levels of the display on the LCD panel 11. The present invention utilizes the generation and application of specific reference voltages to the DAC 130 to attain such object. For example, one group of reference voltages provides into a source driver with n-bit R-DAC, that is, a DAC with a string of resistors. According to the Ohm's law, $2^n$ voltages in R-DAC will be obtained. And according to the present invention, another $2^n$ voltages in R-DAC will be provided by another group of reference voltages. Thus, the source driver with n-bit R-DAC could produce $2^{n+1}$ voltages, and the color-depth of the display on the LCD panel is enhanced. Compared with a source driver with n+1-bit R-DAC, the resistors of R-DAC will be reduced substantially. Thus, the cost of n-bit R-DAC is cheaper than n+1-bit R-DAC, and the possession area of n-bit R-DAC of the source driver is smaller than that of n+1-bit R-DAC. In Gamma Voltage Controlling (GVC) system, LSB is for selecting reference voltages; the other bits are for R-DAC. For example, if 2 bits for reference voltage select, only $2^{n-2}$ resistors are needed in R-DAC. And we can keep $2^n$ output voltages. Besides, if combined with FRC, the FRC side effect will be reduced, too.

For better understanding the principle of the present invention, FIG. 2A to FIG. 2C show a simplified example illustrating how an original 2-bit DAC effectively provides 3-bit and 4-bit function. FIG. 2A shows original voltage levels (Vo1=4V, Vo2=1V) for applying to the DAC 130 (FIG. 1C), as discussed above. Specifically, there are four output voltages 1V, 2V, 3V, and 4V at nodes among resistors R. In order to increase the effective bits (or levels) of the DAC 130, by adding a reference voltage generator the present invention generates new voltage levels (V11=3.5V, V12=0.5V) without overlapping the original voltage levels as shown in FIG. 2B. Specifically, the DAC130 newly generates another output voltage levels 0.5V, 1.5V, 2.5V, and 3.5V depended on the new voltage levels, which we interlaced with the original voltage levels, and are alternatively applied to the DAC. In other words, for example, the original voltage levels are applied to the DAC for generating a first group of output voltages through plural resistors and transmission gates (TG) at a first time, and thereafter the newly generated voltage levels are applied to the same DAC for generating a second group of output voltages through the plural resistors and transmission gates (TG) at a later second time. Similarly, the second output voltages are not overlapping the first output voltages. Furthermore, the second output voltages are interlaced with the first output voltages. According to the present invention, the selection and timing of these two-group voltage levels is defined by one signal of least significant bit (LSB) (FIGS. 1A & 1B). Specifically speaking, for example, when the LSB is logic high, the DAC 130 outputs the first voltages 1V, 2V, 3V, and 4V (or equivalently 001, 011, 101, and 111); thereafter, when the LSB is logic low, the DAC 130 outputs the second voltages 0.5V, 1.5V, 2.5V, and 3.5V (or equivalently 000, 010, 100, and 110). Accordingly, the original 2-bit DAC effectively realizes the function of a 3-bit DAC, and the resolution of the display on the LCD panel 26 is thus improved.

FIG. 2C shows an additional example illustrating how an original 2-bit DAC effectively provides 4-bit function. The voltage levels shown in FIG. 2C include the original 2-bit voltage levels (Vo1=4V, Vo2=1V) and other generated voltage levels (V11=3.75V, V12=0.75V ; V21=3.5V, V22=0.5V ; V31=3.25V, V32=0.25V) by adding three reference voltage generators. Instead of providing two-group voltage levels as in the previous example, herein there are four-group voltage levels, and the selection and timing of these four-group voltage levels is defined by two signals of least significant bits (LSBs). Specifically speaking, for example, when the LSBs are logic 11, the original voltage levels (Vo1=4V, Vo2=1V) are selected and inputted to the DAC, and then the DAC outputs a first group of voltages 1V, 2V, 3V, and 4V (or equivalently 0011, 0111, 1011, and 1111) at a first time; at a second time when the LSBs are logic 10, the newly generated voltage levels (V11=3.75V, V12=0.75V) are selected and inputted to the DAC, and then the DAC outputs a second group of voltages 0.75V, 1.75V, 2.75V, and 3.75V (or equivalently 0010, 0110, 1010, and 1110); at a third time when the LSBs are logic 01, the another newly generated voltage levels (V21+3.5V, V22=0.5V) are selected and inputted to the DAC, and the DAC outputs a third group of voltages 0.5V, 1.5V, 2.5V, and 3.5V (or equivalently 0001, 0101, 1001, and 1101); finally at the fourth time when the LSBs are logic 00, the other newly generated voltage levels V31=3.25V, V32=0.25V are selected and inputted to the DAC, and Then the DAC outputs a forth group of voltages 0.25V, 1.5V, 2.25V, and 3.25V (or equivalently 0000, 0100, 1000, and 1100). Accordingly, the original 2-bit DAC effectively realizes the function of a 4-bit DAC, and the resolution of the display on the LCD panel 11 is thus improved. It is noted that The four-group voltage levels are alternatively and sequentially applied to the DAC at different times. According to the exemplary illustrations of FIG. 2A to FIG. 2C, it is understood on the same reasoning that an LCD circuit using 6-bit source driver could effectively realize, the function of a 8-bit source driver, and obtain the resolution of displaying 256 voltage on the LCD panel 10.

Figure 3A:
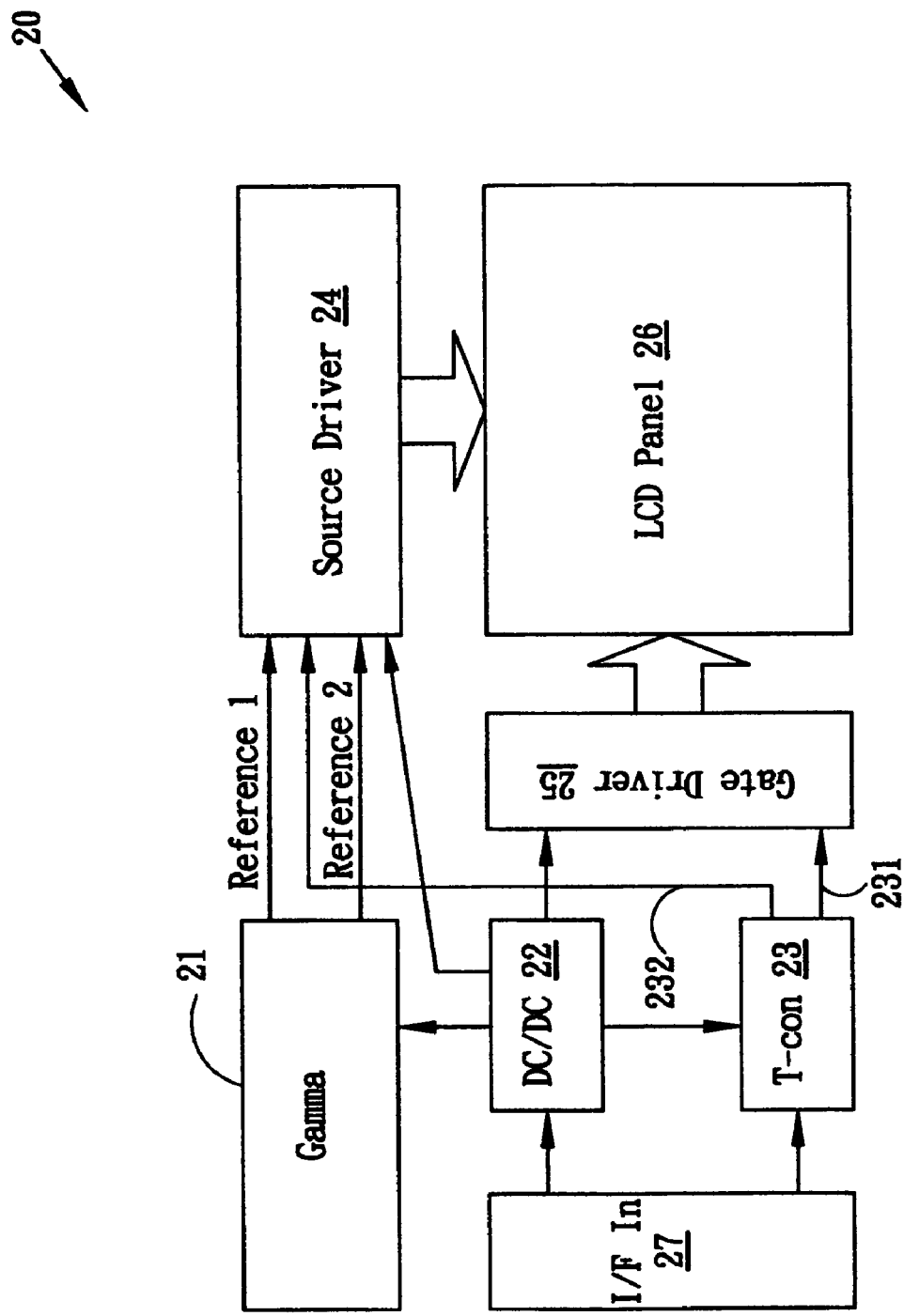
FIG. 3A illustrates the other LCD panel driving circuit for increasing effective bits of the source drivers.

FIG. 3A illustrates the other LCD panel driving circuit 20 for increasing effective bits of the source drivers according to the other embodiment of the present invention. The LCD circuit 20 primarily includes a Gamma voltage generator 21 (at least two groups of reference voltages are provided as shown in this figure), a DC/DC converter 22, a timing controller (T-con) 23, a source driver (also known as formed by a plurality of column drivers) 24, a gate driver (also known as formed by a plurality of row drivers) 25, and an LCD panel 26. And the LCD panel 26 (such as thin-film-transistor (TFT) display) is filled with a plurality of liquid crystal molecules, which are driven by the gate driver 25 and the source driver 24. Specifically, digital video signals, such as R, G, B video signals, and synchronizing signals are inputted to the timing controller 23 via an input interface (I/F In) 27. The timing controller 23 then generates cell driving signals 231 to the gate drivers 25 to control the output timing of the (digital) video signals 232 transmitting to the source driver 24, thereby displaying pictures on the LCD panel 26. The DC/DC converter 22 provides required power to the circuits mentioned above, such as the Gamma voltage generator 21, the timing controller 23, the source driver 24, and the gate driver 25. While the (digital) video signals 232 are processed and converted into analog video signals by the source driver 24, the Gamma voltage generator 21 is a multi-reference voltage generator that comprises at least two reference voltage generators for providing generated reference voltage levels to the source driver 24, especially to the digital-to-analog converter (DAC) therein, as already had been discussed before.

Figure 3B:
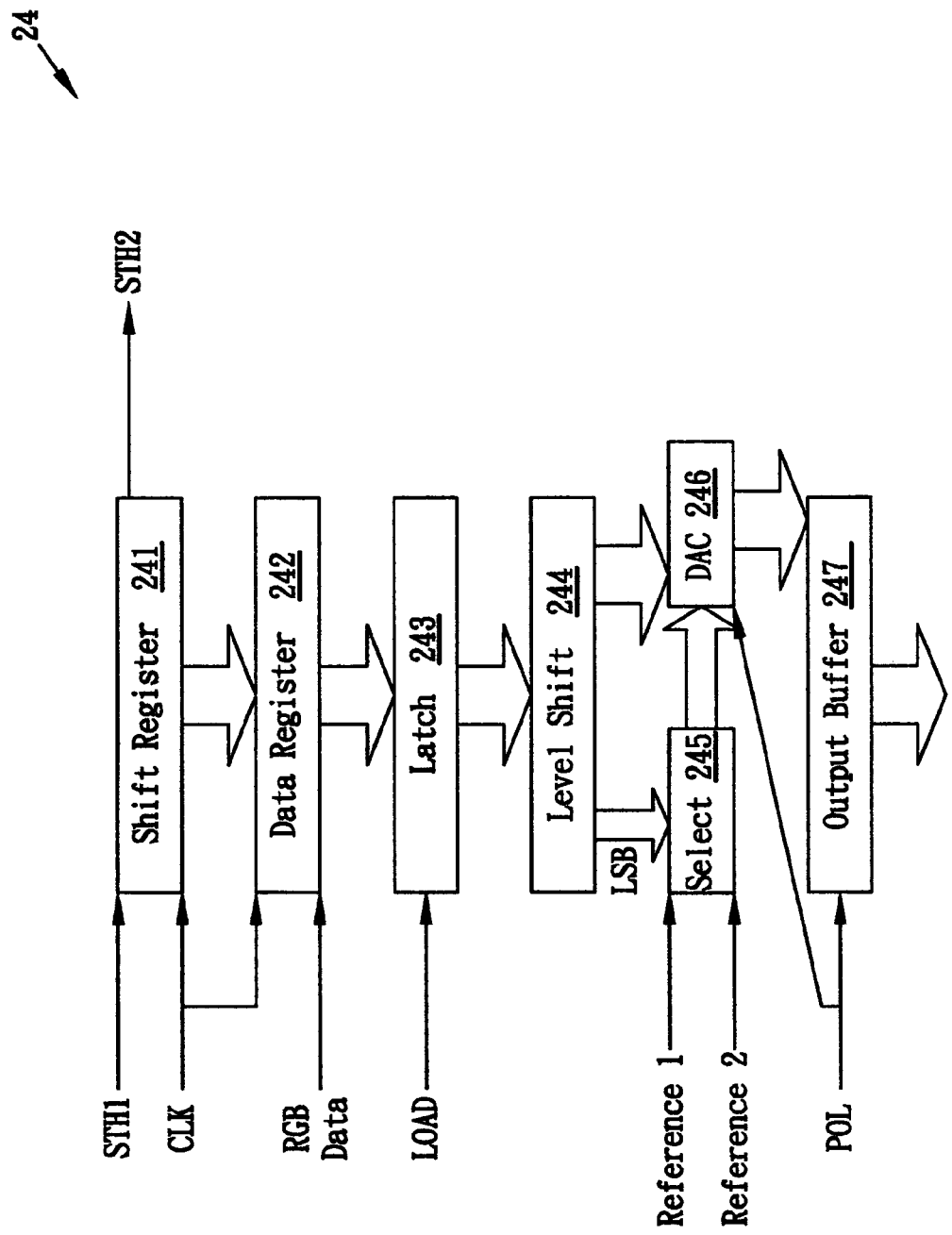
FIG. 3B shows a block diagram of the source driver of FIG. 3A according to one embodiment of the present invention.

FIG. 3B shows a block diagram of the source driver 24 of FIG. 2A according to the other embodiment of the present invention. The source driver 24(as known as integrate circuit chip of driver) includes a shift register 241, a data register 242, a latch 243, a level shifter 244, a selector 245, a DAC 246, and an output buffer 247. The shift register 241 shifts start horizontal signals (STH1/STH2) to synchronizing signals though a source pulse clock (CLK). The data register 242 sequentially samples the (R, G, B) video signals for each column line (data line) according to the output of The shift register 241. The latch 243 then latches the (R, G, B) video signals from the data register 242 through a load signal (LOAD). After the voltage levels of these video signals latched by latch 243, these video signals are appropriately shifted by the level shifter 244, Those video signals are converted into equivalent analog signals by the DAC 246. The output buffer 247 then amplifies and outputs the converted video signals to the LCD panel 26 in accordance with polarity signal (POL). The reference voltages, for example, Reference voltage level 1 and Reference voltage level 2 generated from The gamma voltage generator 21 are simultaneously inputted to the selector 245, where the selector could be a switch or timing controller. One group of The reference voltage level is selected and then provided to The DAC 246 one at a time. The selection of the reference voltages is done by one (or more) least significant bit(s) (LSB) provided, for example, from the level shifter 244.

Figure 4:
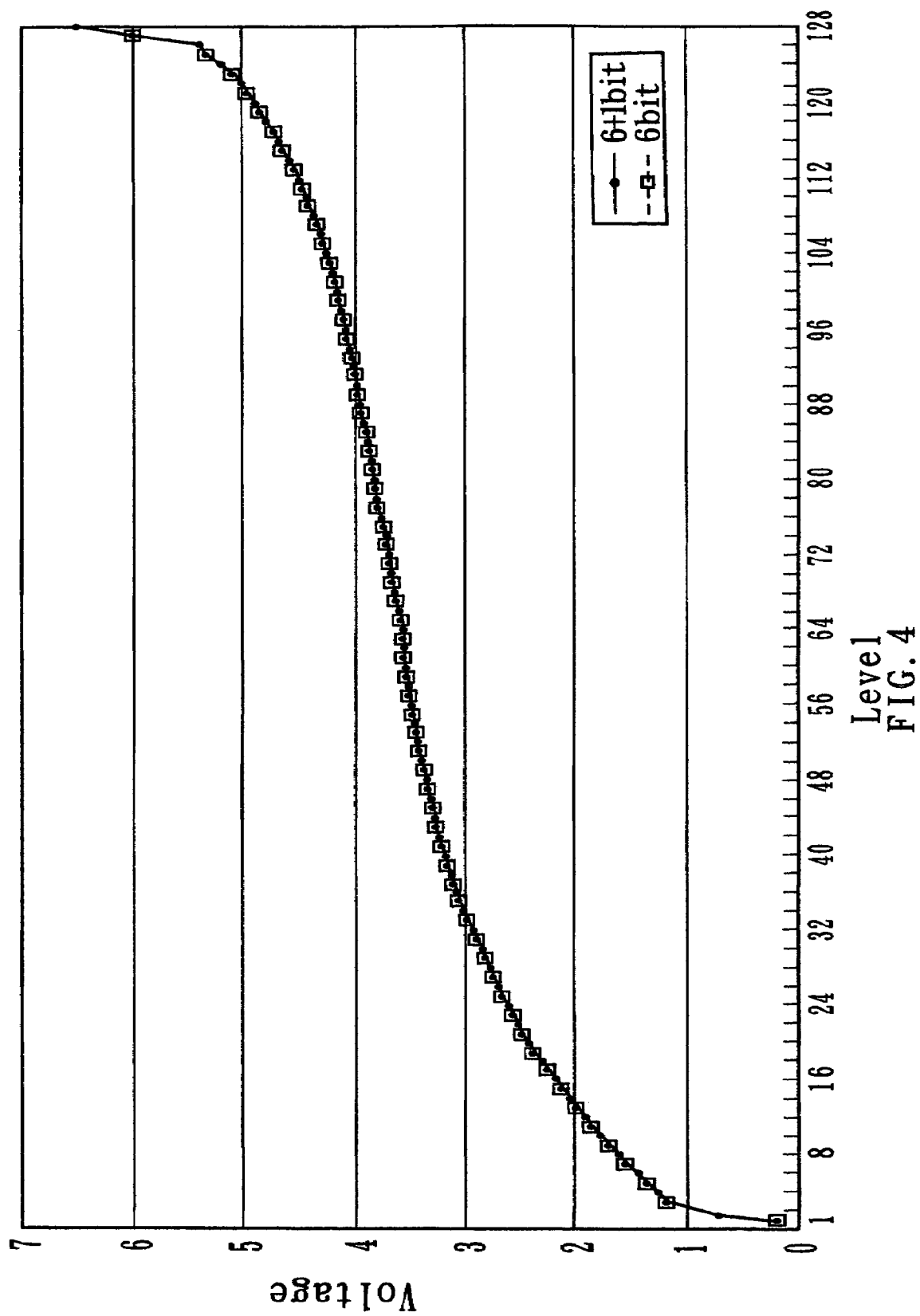
FIG. 4 shows a simulation of increasing one effective bit from a 6-bit DAC according to the present invention.

FIG. 4 shows a simulation of increasing one effective bit from a 6-bit DAC according to the present invention. The figure shows the 64 ($2^6$) voltage of the 6-bit DAC with a square shape, and shows the 128 ($2^7$) voltage of the 6+1 bit DAC with a circle shape. Accordingly, the LCD circuit using 6-bit source driver would effectively realize the function of a 7-bit source driver, and obtain the resolution of displaying 128 voltages on the LCD panel According to above-mentioned driving circuit and driving method of the liquid crystal display (LCD) panel driving circuit of the invention, more than one reference voltage generators for generating $2^{n+m}$ voltage levels are introduced.

In more details, liquid crystal display (LCD) panel driving circuit comprises a source driver with n bit DAC, a gamma voltage generator, and $2^m-1$ reference voltage generators. The gamma voltage generator generates a first group of voltage levels, i.e. an original gamma voltage levels, and then outputs it to n bit DAC to form a first group of $2^n$ output voltages; and each of m-reference voltage generators generates a second group of voltage levels, i.e. a compensated group of voltage levels, and then outputs it to n bit DAC to form a second group of $2^n$ output voltages; wherein the original voltage levels from the gamma voltage generator are not overlapping that from reference voltage generators. That is to say that the original voltage levels are interlaced with compensated voltage levels. Similarly, the output voltages from n bit DAC are not overlapping and interlaced with each other. A selector selects one of the multiple groups of voltage levels to the source driver depended on one or more least significant bit(s) (LSB). Thereafter, the source driver with n bit DAC provides no less than $2^{n+1}$ output voltage for the display, preferably $2^{n+m}$ output voltage. And n and m is a positive integer. Furthermore, the number of reference voltage generators is depending on the desired product design.

Although specific embodiments have been illustrated and described, it will be appreciated by those skilled in the art that various modifications may be made without departing from the scope of the present invention, which is intended to be limited solely by the appended claims.

What is claimed is:

1. A reference voltage controlling method for increasing effective bit of an n-bit digital-to-analog converter (DAC) of a source driver and n is a positive integer, comprising:
    generating a group of original reference voltage levels and a group of compensated reference voltage levels;
    providing at least one least significant bit (LSB) for selecting one of the groups of the original reference voltage levels and compensated reference voltage levels;
    inputting the selected one group of reference voltage levels at a time into the DAC of the source driver; and
    outputting a first $2^n$ output voltages from the DAC when the selected one group of reference voltage levels is the group of the original reference voltage levels and outputting a second $2^n$ output voltage from the DAC when the selected one of reference voltage levels is the group of the compensated reference voltage levels;
    wherein the group of original reference voltage levels does not overlap the group of compensated reference voltage levels, and the first $2^n$ output voltages are interlaced with the second $2^n$ output voltages.

2. The reference voltage controlling method according to claim 1, wherein the at least one least significant bit (LSB) belongs to one or more control signals from a timing controller.

3. The reference voltage controlling method according to claim 1, wherein the digital-to-analog converter (DAC) includes serially connected resistors therein.

4. The reference voltage controlling method according to claim 3, further comprising selectively applying the selected group of reference voltage levels to some nodes among the serially connected resistors.

5. The reference voltage controlling method according to claim 1, wherein the sum of output voltages from the DAC of the source driver is no less than $2^{n+1}$.

6. A display driving circuit comprising:
    a first reference voltage generator for generating a group of original reference voltage levels;
    at least one second reference voltage generator for generating a group of compensated reference voltage levels;
    a selector for selecting one of the groups of original reference voltage levels and compensated reference voltage levels by at least one least significant bit (LSB); and
    a n-bit digital-to-analog converter (DAC) for outputting a first $2^n$ output voltages when receiving the group of original reference voltage levels and outputting a second $2^n$ output voltages when receiving the group of compensated reference voltage levels the first $2^n$ output voltages being interlaced with the second $2^n$ output voltages;
    wherein a source driver receives the selected one group of reference voltage levels at a time.

7. The display driving circuit according to claim 6, wherein the number of the second reference voltage generators is $2^m-1$, and m is a positive integer.

8. The display driving circuit according to claim 7, wherein a sum of output voltages from the DAC of the source driver is about $2^{n+m}$, and n is a positive integer.

9. The display driving circuit according to claim 6, wherein the selector is at least one of a timing controller and a switch.

10. The display driving circuit according to claim 6, further comprising a timing controller inputting one or more control signals to the first and second reference voltage generators.

11. The display driving circuit according to claim 10, wherein the second reference voltage generator receives the at least one significant bit belonging to the one or more control signals.

12. The display driving circuit according to claim 6, wherein the digital-to-analog converter (DAC) includes serially connected resistors therein and selectively applies the selected group of voltage levels at some nodes among the serially connected resistors.

13. The display driving circuit according to claim 6, wherein the first reference voltage generator and the second reference voltage generator are embedded together.

14. The display driving circuit according to claim 6, wherein the second reference voltage generator is embedded in the source driver.

15. An LCD source driver, comprising:
    a data register sequentially sampling input digital video signals;
    a latch for latching the sampled digital video signals; and
    a selector for selecting one group of reference voltage levels, and sequentially and alternatively provides the selected group of reference voltage levels, to a digital-to-analog converter, wherein the reference voltage levels include at least a first group of reference voltage levels and a second group of reference voltage levels, wherein the digital-to-analog converter outputs a first $2^n$ output voltages when receiving the first group of reference voltage levels and outputs a second $2^n$ output voltages when receiving the second group of reference voltage levels, and the first $2^n$ output voltages interlace with the second $2^n$ output voltages.

16. The LCD source driver according to claim 15, further comprising a level shifter for shifting voltage levels of the latch digital video signals.

17. The LCD source driver according to claim 16, wherein the selection in the selector is controlled by at least one least significant bit (LSB) supplied from the level shifter.

18. The LCD source driver according to claim 15, further comprising an output buffer for amplifying the analog video signal from the digital-to-analog converter.

19. The LCD source driver according to claim 15, further comprising at least one reference voltage generator to generate the group of reference voltages.

* * * * *